United States Patent
Basceri et al.

(10) Patent No.: US 6,962,824 B2
(45) Date of Patent: *Nov. 8, 2005

(54) METHOD FOR CONTROLLING DEPOSITION OF DIELECTRIC FILMS

(75) Inventors: Cem Basceri, Boise, ID (US); Dan Gealy, Kuna, ID (US); Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/925,560

(22) Filed: Aug. 25, 2004

(65) Prior Publication Data

US 2005/0019493 A1 Jan. 27, 2005

Related U.S. Application Data

(62) Division of application No. 10/439,774, filed on May 16, 2003, now Pat. No. 6,838,293, which is a division of application No. 09/776,217, filed on Feb. 2, 2001, now Pat. No. 6,566,147.

(51) Int. Cl.⁷ ............................................. H01L 21/00
(52) U.S. Cl. ........................... 438/3; 438/763; 438/785
(58) Field of Search ............................. 438/3, 240, 386, 438/393, 396, 785, 791, 763

(56) References Cited

U.S. PATENT DOCUMENTS

| | | | |
|---|---|---|---|
| 4,261,698 A | 4/1981 | Carr et al. | |
| 4,691,662 A | 9/1987 | Roppel et al. | |
| 5,254,505 A | 10/1993 | Kamiyama | |
| 5,256,455 A | 10/1993 | Numasawa | |
| 5,261,961 A | 11/1993 | Takasu et al. | |
| 5,270,241 A | 12/1993 | Dennison et al. | |
| 5,312,783 A | 5/1994 | Takasaki et al. | |

(Continued)

FOREIGN PATENT DOCUMENTS

| | | |
|---|---|---|
| EP | 0 030 798 | 6/1981 |
| EP | 0 306 069 | 3/1989 |
| EP | 0 388 957 | 9/1990 |
| EP | 0474 140 B1 | 3/1992 |
| EP | 0 474 140 A1 | 3/1992 |
| EP | 0810 666 A1 | 12/1997 |
| EP | 0 855 735 A3 | 7/1998 |
| EP | 0 855 735 A2 | 7/1998 |
| EP | 0 892 426 A2 | 1/1999 |
| EP | 0 957 522 A2 | 11/1999 |
| GB | 2 194 555 | 3/1988 |
| JP | 4 24922 | 1/1992 |
| JP | 4 115533 | 4/1992 |
| JP | 4 180566 | 6/1992 |
| JP | 8 60347 | 3/1996 |
| WO | WO 98/39497 | 9/1998 |
| WO | WO 99/64645 | 12/1999 |
| WO | WO 01/16395 | 3/2001 |

OTHER PUBLICATIONS

Aoyama, et al., "Leakage Current Mechanisms of Amorphous and Polycrystalline $Ta_2O_5$ Films Grown by Chemical Vapor Deposition," *J. Electrochem. Soc.*, 1996;143(3): 977–983.

(Continued)

*Primary Examiner*—Kevin M. Picardat
(74) *Attorney, Agent, or Firm*—Mueting, Raasch & Gebhardt, P.A.

(57) ABSTRACT

A method for controlling stoichiometry of dielectric films, e.g., BST films, preferably formed at low deposition temperatures. A deposition process may use an adjustment in oxidizer flow and/or partial pressure, the provision of a hydrogen-containing component, an adjustment in hydrogen-containing component flow and/or partial pressure, an adjustment in deposition pressure, and/or a modification of system component parameters (e.g., heating a shower head or adjusting a distance between a shower head of the deposition system and a wafer upon which the film is to be deposited), to control the characteristics of the dielectric film, e.g., film stoichiometry.

36 Claims, 3 Drawing Sheets

U.S. PATENT DOCUMENTS

| | | |
|---|---|---|
| 5,392,189 A | 2/1995 | Fazan et al. |
| 5,395,771 A | 3/1995 | Nakato |
| 5,459,635 A | 10/1995 | Tomozawa et al. |
| 5,468,687 A | 11/1995 | Carl et al. |
| 5,470,398 A | 11/1995 | Shibuya et al. |
| 5,525,156 A | 6/1996 | Manada et al. |
| 5,596,214 A | 1/1997 | Endo |
| 5,614,018 A | 3/1997 | Azuma et al. |
| 5,618,761 A | 4/1997 | Eguchi et al. |
| 5,656,329 A | 8/1997 | Hampden-Smith et al. |
| 5,663,089 A | 9/1997 | Tomozawa et al. |
| 5,702,562 A | 12/1997 | Wakahara |
| 5,719,417 A | 2/1998 | Roeder et al. |
| 5,723,361 A | 3/1998 | Azuma et al. |
| 5,731,948 A | 3/1998 | Yializis et al. |
| 5,736,759 A | 4/1998 | Haushalter |
| 5,776,254 A | 7/1998 | Yuuki et al. |
| 5,783,253 A | 7/1998 | Roh |
| 5,798,903 A | 8/1998 | Dhote et al. |
| 5,972,430 A | 10/1999 | DiMeo et al. |
| 5,976,990 A | 11/1999 | Mercaldi et al. |
| 5,989,927 A | 11/1999 | Yamonobe |
| 6,037,205 A | 3/2000 | Huh et al. |
| 6,043,526 A | 3/2000 | Ochiai |
| 6,046,345 A | 4/2000 | Kadokura et al. |
| 6,078,492 A | 6/2000 | Huang et al. |
| 6,101,085 A | 8/2000 | Kawahara et al. |
| 6,127,218 A | 10/2000 | Kang |
| 6,146,907 A | 11/2000 | Xiang et al. |
| 6,153,898 A | 11/2000 | Watanabe et al. |
| 6,215,650 B1 | 4/2001 | Gnade et al. |
| 6,238,734 B1 | 5/2001 | Senzaki et al. |
| 6,258,170 B1 | 7/2001 | Somekh et al. |
| 6,258,654 B1 | 7/2001 | Gocho |
| 6,277,436 B1 | 8/2001 | Stauf et al. |
| 6,285,051 B1 | 9/2001 | Ueda et al. |
| 6,287,935 B1 | 9/2001 | Coursey |
| 6,325,017 B1 | 12/2001 | DeBoer et al. |
| 6,335,049 B1 | 1/2002 | Basceri et al. |
| 6,444,478 B1 | 9/2002 | Basceri et al. |
| 6,525,365 B1 | 2/2003 | Basceri et al. |
| 6,566,147 B2 | 5/2003 | Basceri et al. |
| 6,838,293 B2 * | 1/2005 | Basceri et al. .................. 438/3 |
| 2001/0054733 A1 | 12/2001 | Agarwal et al. |
| 2003/0017266 A1 | 1/2003 | Basceri et al. |

OTHER PUBLICATIONS

Arai et al., "Preparation of SiTiO$_3$ Films on 8–Inch Wafers by Chemical Vapor Deposition," *Jpn J Appl Phys,* 1996;35(pt. 1 No. 9B): 4875–4879.

Basceri, "Electrical and Dielctrial Properties of (Ba,Sr)TiO3 Thin Film Capacitors for Ultra–High Density Dynamic Random Access Memories," *A dissertation submitted to the Graduate Faculty of North Carolina State University,* 1997: 1–171.

Basceri et al., "The dielectric response as a function of temperature and film thickness of fiber–textured (Ba,Sr)TiO$_3$ thin films grown by chemical vapor deposition," *J. Appl. Phys.,* 1997; 82(5): 2497–2503.

Bilodeau et al., "Composition Dependence of the Dielectric Properties of MOCVD Ba$_x$Sr$_{1-x}$TiO$_3$," *MRS Fall Meeting,* 1994: 1–24.

Bilodeau et al., "MOCVD BST for High Density DRAM Applications,"Preprint for Semicon/West, Jul. 12, 1995: 2 pgs.

Choi et al., "Improvements of the Properties of Chemical–Vapor Deposited (Ba,SR)TiO$_3$ Films Through Use of a Seed Layer," *Jpn J Appln Phys,* 1997;36(11) Abstract: 6824–6828.

Chu et al., "Electrical properties and crystal structure of (Ba,Sr)TiO$_3$ films prepared at low temperatures on a LaNiO3 electrode by radio–frequency magnetron sputtering," *Applied Physics Letters,* 1997;70(2) Abstract: 249–251.

Eguchi et al, "Chemical vapor deposition of (Ba,Sr)TiO$_3$ thin films for application in gigabit scale dynamic random access memories," *Integrated Ferroelectrics,* 1997;14(pt. 1 No. 1–4)Abstract: 33–42.

Jia et al., "Structural and dielectric properties of Ba$_{0.5}$Sr$_{0.5}$TiO$_3$ thin films with an epi–RuO$_2$ bottom electrode," *Integrated Ferroelectrics,* 1998; 19(1–4) Abstract: 111–119.

Kawahara et al., "(Ba,Sr)TiO$_3$ Films prepared by Liquid Source Chemical Vapor Deposition on Ru Electrodes," *Jpn J Appl Phys,* 1996;35(9B): 4880–4885.

Khamankar et al., "A Novel low–temperature Process for High Dielectric Constant BST Thin Films for ULSI DRAM Applications," *Microelectronics Research Center, Univ. of Texas at Austin, TX,* 2 pgs. (undated).

Kim et al., "Structural and electrical properties of BaTiO$_3$ grown on p–lnP (100) by low pressure metalorganic chemical vapor deposition at low temperature," *Applied Physics Letters,* 1994;65(15): 1955–1957.

Kim et al., "Advantages of RuOx bottom electrode in the dielectric and leakage characteristics of (Ba,Sr)TiO$_3$ capacitor," *Jpn J Appl Phys,* 1996;35(pt. 1 No. 12A) Abstract: 6153–6156.

Paek et al., "Characterization of MIS capacitor of BST thin films deposited on SI by RF magnetron sputtering," *Ferroelectric Thin Films V Symposium,* Apr. 7–12, 1996, Abstract, San Francisco, CA: 33–38.

Stemmer et al., "Accomodation of nonstoichiometry in (100) fiber–textured (Ba$_x$Sr$_{1-x}$)Ti$_{1+y}$O$_{3+z}$ thin films grown by chemical vapor deposition," *Applied Physics Letters,* 1999;74(17): 2432–2434.

Streiffer et al., "Ferroelectricity in thin films: The dielectric response of fiber–textured (Ba$_x$Sr$_{1-x}$)Ti$_{1+y}$O$_{3+z}$ thin films grown by chemical vapor deposition," *J of Applied Physics,* 1999;86(8): 4565–4575.

Takeuchi et al., "Effect of firing atmosphere on the cubic–hexagonal transition in Ba$_{0.99}$Sr$_{.03}$TiO$_3$," *Nippon Seramikkusu Kyokai Gakujutsu Ronbunshi,* 1990; 98(8) Abstract: 836–839.

Yamaguchi et al., "Reactive coevaporation synthesis and characterization of SrTiO$_3$–BaTiO$_3$ thin films," *Proceedings of the IEEE International Symposium on Applications of Ferroelectrics,* Abstract, Aug. 30–Sep. 2, 1992, Greenville, SC: 285–288.

Yamamichi et al., "(Ba +Sr)ti ratio dependence of the dielectric porperties for (Ba$_{0.5}$)Sr$_{0.5}$TiO$_3$ thin films prepared by ion beam sputtering," *Applied Physics Letters,* 1994;64(13) Abstract: 1644–1646.

Yamamuka et al., "Thermal–Desorption Spectroscopy of (Ba,Sr)TiO$_3$ Thin–Films Prepared by Chemical–Vapor–Deposition," *Jpn J of Appl Phys.,* 1996;35(pt. 1 No. 2A) Abstract: 729–735.

* cited by examiner

METHOD FOR CONTROLLING DEPOSITION OF DIELECTRIC FILMS

This is a divisional of application Ser. No. 10/439,774, filed May 16, 2003, now U.S. Pat. No. 6,838,293, which is a divisional of application Ser. No. 09/776,217, filed Feb. 2, 2001, now U.S. Pat. No. 6,566,147, which are all incorporated herein by reference.

FIELD OF THE INVENTION

The present invention relates to the preparation of semiconductor device structures. More particularly, the present invention pertains to methods of forming high dielectric constant films, such as barium-strontium-titanate film.

BACKGROUND OF THE INVENTION

Various dielectric films have been formed in the past during the fabrication of semiconductor devices. For example, films such as silicon dioxide and silicon nitride have been used for dielectric films in the formation of capacitors, such as for memory devices including, for example, dynamic random access memories (DRAMs). With the shrinkage of minimum feature sizes of semiconductor devices, e.g., increase in memory cell density in DRAMs, there is a continuing challenge to maintain sufficiently high storage capacitance despite decreasing cell area. One way of increasing cell capacitance is through the use of different cell structures such as trench and/or stacked capacitors. However, as feature size continues to become smaller and smaller, development of improved materials for cell dielectrics, as well as the cell structure, have become important.

Conventional dielectrics such as silicon dioxide and silicon nitride may no longer be suitable for use in many devices because of their relatively small dielectric constants. Insulating inorganic metal oxide materials, e.g., ferroelectric materials and perovskite oxides, have gained interest for use as dielectrics in memory devices. Generally, these materials have high dielectric constants which make them attractive as dielectric materials in capacitors, for example, for high density DRAMs and other memory devices. As used in this document, a high dielectric constant refers to a dielectric constant of about 15 or greater. For example, such high dielectric constant materials include tantalum pentoxide ($Ta_2O_5$), barium-strontium-titanate (BST), strontium titanate ($SrTiO_3$), barium titanate ($BaTiO_3$), lead zirconium titanate (PZT), and strontium-bismuth-tantalate (SBT). Using such materials enables the creation of much smaller and simpler capacitor structures for a given storage charge requirement, enabling an increased packing density for memory devices.

The dielectric properties of such films are dependent on various film characteristics, such as the concentration of the components thereof, e.g., the concentration of titanium in a BST film. Further, certain high dielectric constant materials have better current leakage characteristics in capacitors than other high dielectric constant materials. In some materials, aspects of the high dielectric constant material might be modified or tailored to achieve a particularly high dielectric constant, which may unfortunately and undesirably also tend to hurt the leakage characteristics, e.g., increased leakage current. For example, with respect to metal oxides having multiple different metals bonded with oxygen, such as BST, PZT, and SBT, it is found that increasing titanium concentration of the components thereof results in different dielectric characteristics. For example, with respect to BST films, it is found that increasing titanium concentration as compared to barium and/or strontium results in improved leakage characteristics, but decreases the dielectric constant. Accordingly, capacitance can be increased by increasing the concentration of barium and/or strontium, but unfortunately at the expense of an increasing leakage current. Further, absence of titanium in the oxide lattice creates a metal vacancy in such multi-metal titanates which can increase the dielectric constant but unfortunately also increases the current leakage.

It is desirable to form such high dielectric constant films by chemical vapor deposition (CVD) at low deposition temperatures, i.e., less than 680° C. However, although step coverage is better at such low deposition temperatures, deposition rates for the high dielectric constant films is generally lower. Although an increase in deposition rate may occur at higher temperatures, such an increase in temperature over 680° C. may damage barrier materials used in conjunction with the high dielectric constant films.

Generally, at low deposition temperatures, incorporation efficiency of components in the film are affected. For example, relative to high deposition temperature processes for forming BST films, incorporation efficiency of titanium in the formation of such high dielectric constant films decreases in conventional low deposition temperature processes. In fact, the stoichiometry of the high dielectric constant films appear to be self-adjusting in low deposition temperature processes. In other words, changing precursor flow ratios does not affect film composition at lower deposition temperatures, unlike the significant effect such changing of precursor flow ratios has in high temperature CVD processes. For example, with respect to BST films, a change in precursor flow ratio (e.g., Ba/Sr to Ti ratio) does not substantially affect film composition of a deposited BST film at temperatures less than 680° C.

In many circumstances, it may be desirable to have varied concentrations within a high dielectric constant film (in other words, for example, changing the stoichiometry of different layers or portions of a BST film as it is deposited) deposited using low deposition temperature CVD processes. Since film composition is not affected by the conventional method of changing precursor flows, new methods of controlling the stoichiometry of high dielectric constant films are needed. Further, even if a film's stoichiometry is controlled to a certain degree by changing precursor flow, the control of stoichiometry by changing precursor flow is disadvantageous in that, for example, extensive time for conditioning is required to change such flows.

SUMMARY OF THE INVENTION

The present invention provides the ability to control stoichiometry of dielectric films, e.g., high dielectric constant BST films, preferably at low deposition temperatures. For example, a deposition process according to the present invention may use an adjustment in oxidizer flow and/or partial pressure, the provision of a hydrogen-containing component, an adjustment in hydrogen-containing component flow and/or partial pressure, an adjustment in deposition pressure, and/or a modification of system component parameters (e.g., heating a shower head or adjusting a distance between a shower head of the deposition system and a wafer upon which the film is to be deposited), to control the high dielectric constant film characteristics, e.g., film stoichiometry.

A method for depositing a film according to the present invention includes providing a substrate assembly having a surface in a deposition chamber, preferably at a temperature less than 680° C. A barium-containing organometallic precursor, a strontium-containing organometallic precursor, a titanium-containing organometallic precursor, and optionally at least one oxidizer and at least one hydrogen-containing composition are provided to the deposition chamber. A barium-strontium-titanate film is formed on at least a portion of the surface using the barium-containing organometallic precursor, the strontium-containing organometallic precursor, the titanium-containing organometallic precursor, and optionally the at least one oxidizer and/or the at least one hydrogen containing composition provided to the deposition chamber. The barium-strontium-titanate film formed includes at least a first layer of the barium-strontium-titanate film having a first composition and at least a second layer of the barium-strontium-titanate film having a second composition The formation of the film is controlled in one or more various manners. For example, the deposition process may be controlled by adjusting the flow rate of the at least one oxidizer to the deposition chamber and/or a partial pressure of the at least one oxidizer in the deposition chamber during formation of the barium-strontium-titanate film such that composition of the barium-strontium-titanate film is adjusted from the first composition to the second composition. The oxidizer provided to the deposition chamber may be at least one of $O_2$, $O_3$, $N_2O$, $NO$, $SO_3$, $H_2O_2$, $R_2O_2$, where R is selected from a group consisting of a saturated or unsaturated linear, branched, or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like.

Further, the deposition process may be controlled by adjusting a deposition pressure of the deposition chamber during formation of the barium-strontium-titanate film.

Yet further, the deposition chamber may include a delivery device having a delivery outlet region. The deposition process may then be controlled by adjusting a distance between the delivery outlet region of the delivery device and the surface of the substrate assembly during formation of the barium-strontium-titanate film and/or by adjusting a temperature of at least the delivery outlet region of the delivery device during formation of the barium-strontium-titanate film.

In addition, the deposition process may be controlled by adjusting the flow rate of the at least one hydrogen-containing composition provided to the deposition chamber and/or a partial pressure of the at least one hydrogen-containing composition in the deposition chamber during formation of the barium-strontium-titanate film. The hydrogen-containing composition may include one or more of $H_2$, $NH_3$, $N_2H_4$, $N_2H_3(CH_3)$, and $H_2O$.

Such adjustments to the process may be performed while maintaining a flow rate of the barium-containing organometallic precursor, strontium-containing organometallic precursor, and the titanium-containing organometallic precursor provided to the deposition chamber.

In one embodiment of the method, the first layer of the barium-strontium-titanate film is an interfacial layer and the second layer of the barium-strontium-titanate film is a bulk layer. The interfacial layer has an atomic percent of titanium less than or equal to the atomic percent of titanium in the bulk layer of the barium-strontium-titanate film.

In another embodiment, the adjusting of the deposition pressure of the deposition chamber during formation of the barium-strontium-titanate film while a flow rate of the barium-containing organometallic precursor, the strontium-containing organometallic precursor, and the titanium-containing organometallic precursor to the deposition chamber is maintained is such that composition of the barium-strontium-titanate film is adjusted from the first composition to the second composition. Further, with an increase in deposition pressure, an increase in percent titanium in the barium-strontium-titanate film and also an increase in a rate of deposition of the barium-strontium-titanate film can be attained.

The deposition processes described above may be used to form a barium-strontium-titanate dielectric film for use in formation of a capacitor. In other words, a first electrode having a surface in a deposition chamber is provided, a barium-strontium-titanate dielectric film is formed on at least a portion of the surface of the first electrode, and thereafter, a second electrode is formed on at least a portion of the barium-strontium-titanate dielectric film.

Similar methods as described above may be used to form an $ABO_3$ dielectric film. For example, a substrate assembly having a surface may be provided in a deposition chamber at a temperature less than 680° C. A plurality of precursors including A and B and an oxidizer (and optionally, at least one hydrogen-containing composition) are provided to the deposition chamber having the substrate assembly positioned therein to deposit a film of $ABO_3$ on at least a portion of the surface of the substrate assembly. One or more of the control techniques described above may be used during deposition of the $ABO_3$ film to produce different concentrations of one of A and B at different elevations in the $ABO_3$ film.

In various embodiments, the different concentrations include a concentration in a first layer of the $ABO_3$ film that is different from a concentration of a second layer of the $ABO_3$ film and/or the different concentrations are a gradient in concentrations in at least a portion of the $ABO_3$ film.

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

DETAILED DESCRIPTION OF THE EMBODIMENTS

Figure 1:
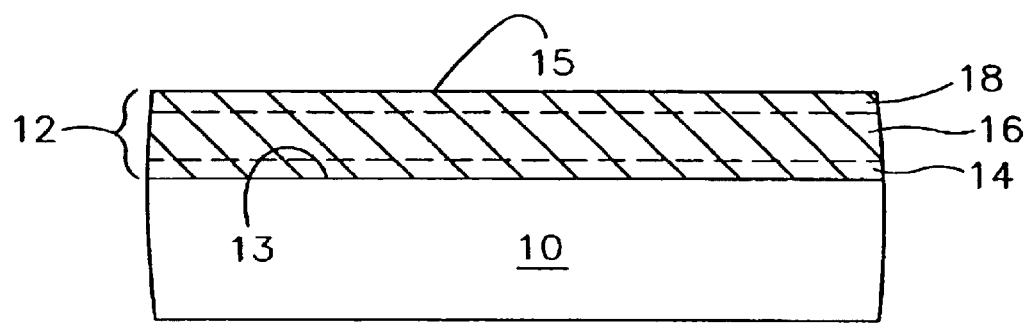
FIG. 1 is a cross-sectional schematic of a structure including a high dielectric constant film formed in accordance with the present invention.

The present invention provides the ability to control stoichiometry in high dielectric constant films, for example, a high dielectric constant film such as a (Ba,Sr)TiO$_3$ (barium-strontium-titanate or BST) film. FIG. 1 shows a high dielectric constant film 12 formed in accordance with the present invention. The high dielectric constant film 12 can be formed on a surface 13 of a substrate assembly 10.

As used herein, "substrate assembly" refers to either a semiconductor substrate, such as the base semiconductor layer, e.g., the lowest layer of a silicon material on a wafer, or a silicon layer deposited on another material, such as silicon on sapphire, or a semiconductor substrate having one or more films, layers, or structures formed thereon or regions formed therein. When reference is made to a "substrate assembly" in the following description, various process steps may have been previously used to form or define regions, junctions, various structures or features, and openings such as vias, contact openings, high aspect ratio openings, etc.

Figure 2:
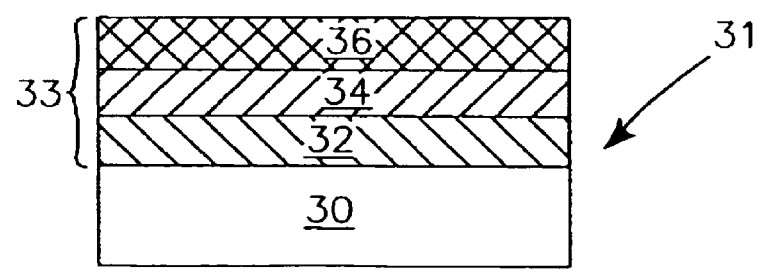
FIG. 2 is a cross-sectional schematic of one embodiment of a capacitor structure including a high dielectric constant film formed in accordance with the present invention.

For example, as used herein, substrate assembly 10 may refer to a structure upon which a dielectric film of a capacitor structure is formed, as shown in FIG. 2. Further, such a substrate assembly, e.g., substrate assembly as shown in FIG. 1, may generally include electrode materials such as, for example, platinum, platinum rhodium, ruthenium, ruthenium oxide, iridium, iridium oxide, palladium, titanium nitride, tungsten nitride, and various combinations of layers thereof or any other electrode materials. For example, such electrode materials may generally be positioned between the high dielectric constant film formed according to the present invention and a silicon-containing material, e.g., silicon or polysilicon, or may be positioned on a barrier layer.

Further, as used herein, "film" refers to a substantially continuous sheet of a composition. Film is to be distinguished from a layer in that a "layer" can be a stratum of the film such that a film may include one, two, or more layers. For example, as described herein, one or more layers may be formed which have a different composition or stoichiometry from one or more other layers of the dielectric film. Further, the film may have a varying concentration throughout the entire film, or such a concentration gradient in a portion of the film. As described further below, such a difference in the composition of the film from a region adjacent surface 13 of substrate assembly 10 through the upper surface 15 of the high dielectric constant film 12 may be varied or adjusted such that a desired stoichiometry for the high dielectric constant film 12 is attained.

Substantial portions of the description herein are directed to the stoichiometry control of BST films. However, the overall general concept of controlling stoichiometry of a high dielectric constant film, and therefore the capacitance of a capacitor structure including such a high dielectric constant film, is applicable to other dielectric films as well as the BST films. For example, the stoichiometry control of the atomic percent of one or more metal components in any metal-containing dielectric film, e.g., a dielectric film formed using one or more organometallic precursors, may be attained according to the present invention. Further, deposition rate of such a dielectric film may also be controlled according to the present invention.

For example, the present invention may be beneficial for forming high dielectric constant films such as high dielectric constant ABO$_3$-comprising dielectric films, where "A" is at least one element selected from a group consisting of Group IIA and Group IVB metal elements, and where "B" is at least one element selected from a group consisting of Group IVA elements. In the context of this application, Group IIA metal elements consist of Be, Mg, Ca, Sr, Ba, and Ra; Group IVB metal elements consist of Sn and Pb; and further, Group IVA elements consist of Ti, Zr, Hf, and Rf Further, for example, high dielectric constant films may include (Ba,Sr)TiO$_3$ [BST]; BaTiO$_3$[BT]; SrTiO$_3$[ST]; PbTiO$_3$; Pb(Zr,Ti)O$_3$[lead-zirconium-titanate or PZT]; (Pb, La)(Zr,Ti)O$_3$[PLZT]; (Pb,La)TiO$_3$[PLT]; KNO$_3$; LiNbO$_3$; (SrBi$_2$Ta$_2$O$_9$) [strontium-bismuth-tantalate or SBT]; SrBi$_2$(Nb,Ta)$_2$O$_9$ [SBTN]; SrBi$_2$Nb$_2$O$_9$[strontium-bismuth-niobium or SBN]; Ta$_2$O$_5$ (and also doped Ta$_2$O$_5$, e.g., Ti-doped Ta$_2$O$_5$); TA$_x$O$_y$N$_z$[tantalum oxynitride]; ZrO$_2$; ZrSiO$_x$; HfO$_2$; and HfSiO$_x$. However, for simplicity, the remainder of the description herein focuses particularly on BST films. One skilled in the art will recognize that the applicable concepts described with regard to the BST films may be translated to the other films described above.

It is desirable in many instances to form high dielectric constant films of capacitors or for other purposes, such as BST films, that have varied concentrations at different elevational locations in the thickness of such films. For example, with respect to BST films, the quantity of titanium impacts leakage current characteristics and dielectric constant values in the subject film. Accordingly, in some instances it might be desirable to fabricate a layer of the film in one elevational range at a first composition or stoichiometry, and another layer in another elevational range of the film to have a different stoichiometry or composition, utilizing the same or different combinations of elements. Further, film morphology can be affected by the concentration of the barium, strontium, or titanium in the deposited BST film.

Conventionally, one method of providing variable stoichiometry at selective locations throughout the thickness of a BST film is to vary the precursor flows to the reactor chamber during a chemical vapor deposition process used to form the film. For example, where higher titanium content is desired, the flow rate of titanium precursors would typically be increased relative to the other precursors. Likewise, where less titanium is desired, the flow rate of titanium precursors would be reduced to achieve lower titanium content in a desired portion of a deposited BST film. However, changing the precursor flow as described in the Background of the Invention section herein does not suitably produce the desired stoichiometry changes when the BST films are deposited by low temperature CVD processes, i.e., less than 680° C. Further, changing the precursor flows does not result in an instantaneous change in titanium concentration in the deposited BST film, and further, there is a stabilization problem in varying precursor flows with a corresponding lag in formation of a selected stoichiometry.

Illustrative examples of a BST-film having different layers thereof with different stoichiometries for which the present invention may be utilized are described in U.S. Pat. No. 5,783,253 to Roh, entitled "Method for forming a dielectric film and method for fabricating a capacitor using the same" (issued 21 Jul. 1998) and in U.S. patent application Ser. No. 09/385,581, entitled "Dielectric Films and Methods of Forming Same" assigned to the current assignee hereof, Micron Technology, Inc. For example, as described in U.S. patent application Ser. No. 09/385,581, there is a need to control the stoichiometry of an interfacial layer (i.e, interfacial layer 14 shown in FIG. 1), such that the interfacial layer 14 does not have a dielectric constant that is lower than the remainder of the film (i.e., bulk layer 16, also shown in FIG. 1). The stoichiometry of the interfacial layer 14 can be controlled according to the present invention such that preferably the interfacial layer 14 does not have a dielectric constant lower than the bulk layer 16, i.e., the dielectric constant of the interfacial layer is equal to or greater than the dielectric constant of the bulk layer 16.

With regard to BST films, $(Ba,Sr)TiO_3$ used to form such films is an $ABO_3$-type perovskite structure. As such, and in accordance with the present invention, preferably the ratio (Ba,Sr)/Ti is controlled to achieve the desired dielectric constant results. However, further, the ratio Ba/Sr may be controlled to achieve the desired dielectric constant results. Yet further, control of both such ratios may be used to achieve the desired dielectric constant. The present invention can be used to tailor such ratios.

Preferably, with respect to the (Ba,Sr)/Ti ratio, the interfacial layer 14 includes an atomic percent titanium that is less than or equal to an atomic percent titanium in the bulk layer 16. Further, with respect to the Ba/Sr ratio, interfacial layer 14 includes a greater amount atomic percent of barium relative to the atomic percent of strontium, i.e., the Ba/Sr ratio is greater than 1.

Further, and more preferably, with respect to the (Ba,Sr)/Tri ratio, if the atomic percent of titanium in the bulk layer 16 is represented by x, then preferably the atomic percent of the interfacial layer 14 can be represented as being in the range of x-1 atomic percent to x-3 atomic percent. In many applications, for example, it is preferred that the dielectric film contain the target atomic percent from about 50.0 atomic percent titanium to about 53.5 atomic percent titanium. Therefore, x is preferably from about 50.0 to about 53.5, assuming that the target atomic percent titanium of the dielectric film is equal to the atomic percent of the bulk layer 16. As such, the interfacial layer 14 preferably is targeted to contain from about 1 atomic percent to about 3 atomic percent less titanium than the bulk layer 16. For example, if the target atomic percent titanium in a dielectric film 12 is about 53 atomic percent, then the interfacial layer 14 is preferably targeted to contain from about 50.0 atomic percent to about 53.0 atomic percent titanium. Further, for example, if the target atomic percent is about 50.5 atomic percent, then the interfacial layer 14 is preferably targeted to contain from about 47.5 atomic percent titanium to about 50.5 atomic percent titanium (preferably, less than 50.5 atomic percent).

As shown in FIG. 1, the high dielectric constant film 12 includes the interfacial layer 14, bulk layer 16, and one or more additional layers 18. It will be recognized by one skilled in the art that the above illustrative example for control of stoichiometry for the interfacial layer versus the bulk layer is but one illustrative example of the need to control stoichiometry in a BST film. However, the stoichiometry or composition of the film, e.g., layer by layer or on a continuous gradient from surface 13 to surface 15, can be controlled according to the present invention. For example, each of the layers 14, 16, and 18 may have a different stoichiometry or composition. For example, interfacial layer 14 may have a composition wherein titanium atomic percent is less than that in the bulk layer 16, and the additional layer 18 may have a composition wherein the titanium atomic percent is greater than the bulk layer 16 and the interfacial layer 14. Further, for example, the BST film 12 may have a variant titanium atomic percent that increases across the entire dielectric film 12 from the surface 13 to the upper surface thereof or may have a titanium atomic percent variation that begins and continually increases in the bulk layer 16 through the one or more additional layers 18 while the interfacial layer 14 has a desired fixed composition titanium atomic percent. One skilled in the art will recognize that the number of possible high dielectric constant films having varied stoichiometry through use of the present invention to control the stoichiometry thereof are endless, and further that those listed herein are for illustration only and in no manner limit the present invention to any particular film.

Preferably, according to the present invention, the high dielectric constant film 12 is formed by chemical vapor deposition (CVD). CVD is one process for forming relatively thin films on semiconductor wafers, such as films of elemental metals or compounds. CVD, as used herein, refers to the formation of a solid layer or film on a surface by the reaction of vapor phase reactants that contain desired components. The vapors are introduced into a reactor vessel or deposition chamber and decompose and/or react at a surface on a substrate assembly, e.g., wafer, to form a desired film. For example, a compound, typically a heat decomposable volatile compound (also known as a precursor), is delivered to a substrate assembly surface in the vapor phase. A surface which has been heated to a temperature about the decomposition temperature of the precursor is exposed to the vaporized precursor. A coating or film forms on the surface. The film generally depends upon the type of precursor and deposition conditions employed.

The present invention describes various techniques of controlling film stoichiometry for high dielectric constant films formed by CVD. Generally, such techniques of controlling film stoichiometry effectively during low temperature CVD processes include: adjusting an oxidizer flow rate and/or partial pressure during the film formation process, adjusting a distance between a vaporized precursor delivery device and a substrate assembly upon which the film is to be formed, adjusting the temperature of a delivery device used to deliver vaporized precursor to the deposition chamber, providing a hydrogen-containing component to the deposition chamber during formation of the high dielectric constant film, and adjusting a hydrogen-containing component flow rate to the deposition chamber and/or a partial pressure thereof during formation of the high dielectric constant film. Further, as described in U.S. patent application Ser. No. 09/580,733, entitled "Chemical Vapor Deposition Methods and Physical Vapor Deposition Methods" assigned to the current assignee hereof, Micron Technology, Inc., adjusting deposition chamber pressure during the chemical vapor deposition process of forming the high dielectric constant film can also be used to control stoichiometry of high dielectric constant films. One or more of the above techniques may be used to attain a desired film stoichiometry according to the present invention. Preferably, control of the stoichiometry or composition of the film 12 via one or more of the above techniques is performed without changing precursor flows to the deposition chamber during the deposition of the high dielectric constant film 12.

Figure 3:
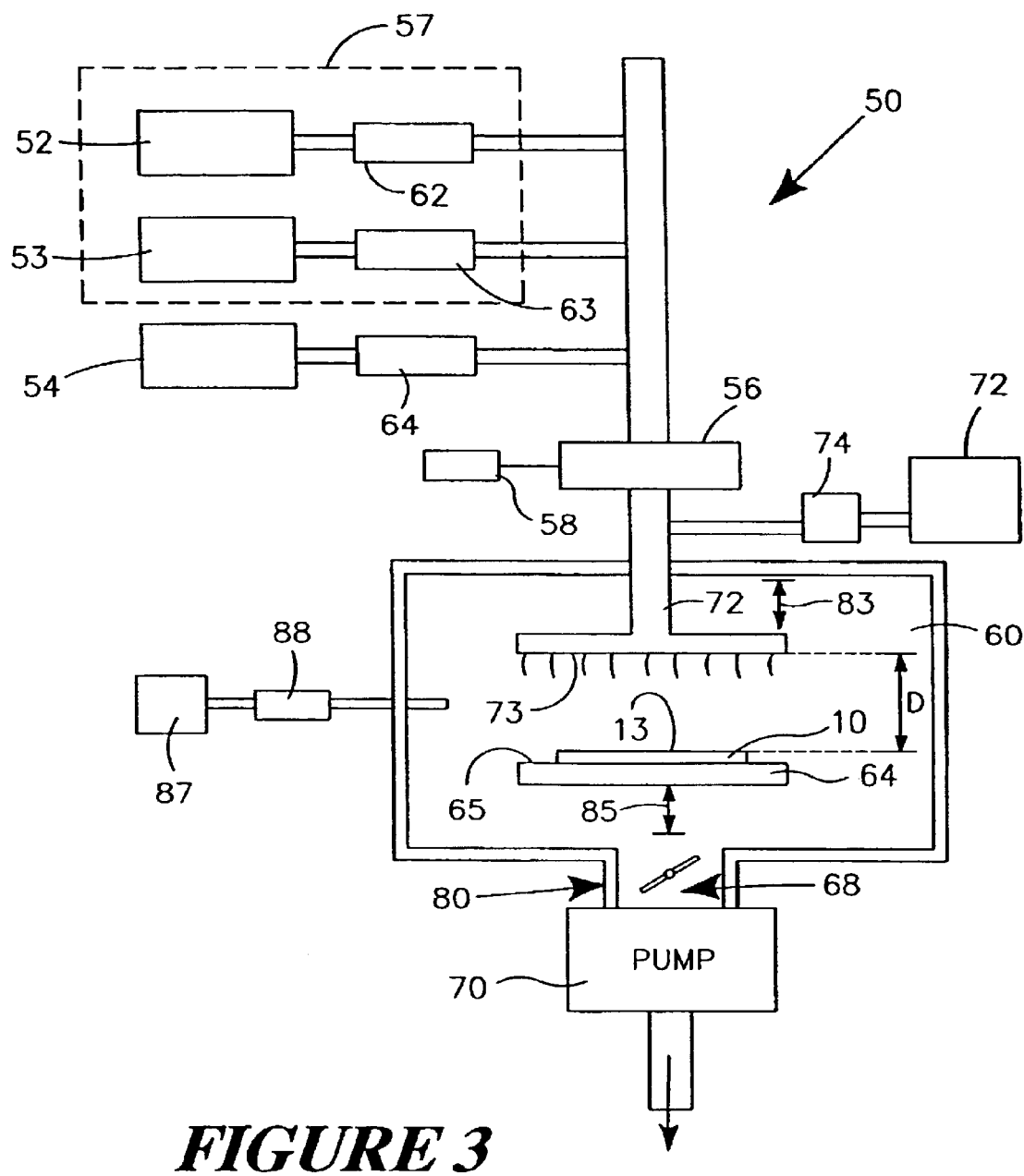
FIG. 3 is a schematic diagram of an exemplary system useable in accordance with the present invention in formation of an exemplary high dielectric constant film.

An exemplary CVD process in which a BST film 12 is formed according to the present invention and in which the stoichiometry of the BST film 12 is controlled during such formation shall be described with reference to FIG. 3. FIG. 3 illustrates but one exemplary chemical vapor deposition system 50 in accordance with the present invention. A substrate assembly on which deposition is to occur is placed in reaction or deposition chamber 60 of the CVD system 50.

Any suitable CVD apparatus design may be used in the present invention, e.g., hot wall reactors, cold wall reactors, radiation beam-assisted reactors, plasma-assisted reactors, and the like. For blanket deposition, a cold wall-hot substrate reactor may sometimes be preferred as this design is efficient in regards to precursor consumption. For example, the CVD processes described herein may be carried out in a chemical vapor deposition reactor, such as a reaction chamber available under the trade designation of 7000 from Genus, Inc. (Sunnyvale, Calif.); a reaction chamber available under the trade designation of 5000 from Applied Materials, Inc. (Santa Clara, Calif.); or a reaction chamber available under the trade designation of Prism from Novelus, Inc. (San Jose, Calif.). However, any reaction chamber suitable for performing CVD may be used.

The exemplary CVD system 50 includes a barium-containing organometallic precursor source 52, a strontium-containing organometallic precursor source 53, and a titanium-containing organometallic precursor source 54. Such sources are combined under control of flow controllers 62–64 to feed a vaporizer 56. An inert gas stream 58 may also be provided to vaporizer 56 to facilitate flow of the vaporized precursors to the downstream deposition chamber 60.

Preferably, the method for forming the high dielectric constant film 12 from organometallic precursors is carried out where the precursors may be a liquid or a solid at room temperature. Typically, however, such precursors are liquids. If they are solids, they are preferably sufficiently soluble in an organic solvent or have melting points below their decomposition temperature such that they can be used in flash vaporization, bubbling, microdroplet formation techniques, etc. However, they may also be sufficiently volatile that they can be vaporized or sublimed from the solid state using known chemical vapor deposition techniques. Thus, the precursor composition of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material. Preferably, however, there is a sufficient amount of the material that can be carried by the organic solvent into the vapor phase for chemical vapor deposition processing.

If the organometallic precursor is a liquid, it may be delivered through use of bubbling techniques. Generally, with use of a bubbling technique for delivery, a liquid precursor is contained in a bubbler reservoir through which a carrier gas, such as helium or any other inert gas, i.e., a gas that is non-reactive with other gases in the process, e.g., nitrogen, argon, neon, and xenon, is passed. In other words, the carrier gas is bubbled through the reservoir containing the organometallic precursor to deliver the precursor to the reaction chamber.

However, preferably, CVD of BST films is accomplished using a liquid delivery system as shown in FIG. 3. In such a system, organometallic precursors (e.g., barium-betadiketonates, strontium-betadiketonates, and titanium-betadiketonates for BST films) are dissolved in a high vapor pressure solvent (e.g., tetrahydrofuran, butylacetate, etc.) to form a solution of organometallic precursor. This solution is then delivered to the vaporizer 56 wherein vaporization is performed with the vaporized precursor being delivered into the deposition chamber 60. Preferably, the solution is delivered to the vaporizer 56 using a controllable device, such as flow controllers 62–64, e.g., micropumps. Although one or more precursors may be premixed prior to being delivered to the vaporizer by the controllable devices 62–64, e.g., a mixture of barium-containing precursor and strontium-containing precursor as shown generally by dashed mixer block 57, it may be desirable for other precursors to be provided separately to the vaporizer 56 by one of controllable devices 62–64, e.g., a titanium-containing precursor provided separately by controller 64.

The chemical vapor deposition chamber 60 is connected downstream of vaporizer 56. A vaporized precursor delivery device 72, e.g., showerhead, operably coupled to the vaporizer 56 receives and distributes the vaporized precursors into the deposition chamber 60. A suitable substrate assembly holder 66, e.g., a wafer holder, is received within chamber 60 with the substrate assembly thereon. Generally, the reaction chamber 60 and the substrate assembly surface 13 upon which deposition is to occur are maintained at a pre-selected temperature by, for example, an internal heater chuck. Preferably, the substrate assembly surface 13 is maintained at a low deposition temperature that is less than 680° C. More preferably, the deposition temperature is in the range of about 400° C. to about 550° C. to attain continuity in the deposited layer at thicknesses at or below 200 Å and, preferably, at least down to 50 Å. Preferably, the deposition temperature is kept at or maintained during the deposition of the BST film and any changes in stoichiometry of the film 12.

The deposition of the high dielectric constant film is preferably conducted at sub-atmospheric pressure with a vacuum pump 70 being diagrammatically illustrated for achieving a desired vacuum pressure within chamber 60. According to the present invention, and as previously described in U.S. patent application Ser. No. 09/580,733, stoichiometry of the BST film can be controlled by adjusting the deposition pressure during formation of the BST film 12. For example, the deposition pressure during deposition of the BST film may be varied at one point during the deposition process by manipulating a vacuum pressure control device associated with the deposition chamber 60 to produce desired different compositions of BST at different elevations in the deposited film 12. For example, the deposition pressure may be varied to decrease or increase the titanium concentration of the dielectric BST film 12 such that interfacial layer 14 has a different concentration of titanium than bulk layer 16. Generally, as described in U.S. patent application Ser. No. 09/580,733, titanium incorporation in the BST film can be increased by an increase in deposition pressure.

By way of example only, such pressure control device may include the illustrated vacuum pressure control valve 68 provided proximate chamber 60. Alternately, by way of example only, such manipulation might comprise changing upstream ballast flow to vacuum pump 70 downstream of deposition chamber 60, such as represented by arrow 80. For a given vacuum pump speed, addition of ballast control gas will decrease the degree of vacuum achieved within chamber 60 for increasing flows of ballast gas, assuming constant vacuum pump speed. Further, by way of example only, such manipulation of a control device to control vacuum pressure within the chamber might comprise changing the speed of vacuum pump 70. Such manipulation of vacuum deposition pressure by actuating a direct controlling device associated with the deposition chamber 60 is most preferred in accordance with the present invention as enabling rapid control of ambient pressure and changes associated therewith within the chamber 60.

Preferably, the deposition pressure is adjusted within the range of 100 millitorr to 20 torr to control stoichiometry of the film 12 being deposited. More preferably, the deposition pressure is in the range of about 1 torr to 6 torr. Such pressures are largely dependent on, for example, the pumping speed of the vacuum equipment, the chamber volume, and the vapor pressure of the precursors being used.

Generally, the vaporized precursor delivery device 72 receives and distributes the vaporized precursors within the deposition chamber 60. The delivery device 72 generally includes a delivery surface 73 having openings therein for providing the vaporized gaseous precursors into the deposition chamber 60. Preferably, the delivery device 72 is one of any number of showerhead devices commonly known to one skilled in the art.

According to the present invention, positioning of the delivery device 72 relative to the substrate assembly held by substrate assembly holder 66 can be used to control the stoichiometry of the BST film 12 being deposited on the substrate assembly 10. As shown in FIG. 3, preferably, the delivery device 72 includes surface 73 including openings for delivering the vaporized precursor, wherein the surface of the delivery device 73 is generally parallel to the surface 13 of the substrate assembly or an upper surface 65 of substrate assembly holder 66. As shown in FIG. 3, the distance between the delivery device 72 and the substrate assembly is generally shown as distance (D).

To control stoichiometry of the film 12 being deposited, according to the present invention, distance (D) may be varied. For example, as the spacing between the delivery device 72 and substrate assembly decreases, or, in other words, as D decreases, atomic percent of titanium in the BST film deposited decreases, whereas the atomic percent of barium in the BST film increases. As such, one can adjust the spacing distance (D) to attain a desired stoichiometry in one or more layers or portions of the BST film 12.

As shown in FIG. 3, either one or both of the delivery device 72 or the substrate assembly may be moved to adjust distance (D) according to the present invention. Such movement may be performed under control of any mechanical and/or electrical apparatus suitable for controlling such movement of these elements and is represented generally by double arrows 83, 85. The double arrow 83 represents movement of the delivery device 72, whereas double arrow 8represents adjustment of the position of substrate assembly and/or substrate assembly holder 66.

Also according to the present invention, the temperature of the delivery device 72, e.g., showerhead, can be adjusted to control stoichiometry of the BST film 12. Generally, the minimum temperature of the showerhead would be about 50° C. higher than the vaporization temperature of the precursors to prevent condensation thereof. The maximum temperature would be around 100° C. less than the deposition temperature. Therefore, for example, temperature of the showerhead can be varied in the range of about 300° C. to about 450° C. for low temperature BST chemical vapor deposition processes (e.g., the deposition temperature being in the range of about 400° C. to about 550° C.). Such temperature adjustment can be provided in the showerhead by resistively heating, conductively heating, radiatively heating, or thermoelectrically heating the showerhead. The varied temperatures of the delivery device 72 affect various precursors differently, e.g., tend to break down vaporized precursors differently and affect the amount of incorporation of metals thereof into the film. Therefore, by varying the temperature of the delivery device 72, incorporation of different percentages of barium, strontium, or titanium into the BST film can be controlled.

In the deposition process of forming the BST film 12, an oxidizer feed stream from oxidizer source 72 under control of flow controller 74 is preferably provided upstream of the delivery device 72 with the barium-containing organometallic precursor, strontium-containing organometallic precursor, and titanium-containing organometallic precursor. The oxidizer is typically in the form of a gas. More preferably, the oxidizer is an oxygen-containing gas selected from a group consisting of oxygen ($O_2$), ozone ($O_3$), $N_2O$, NO, $SO_3$, $H_2O_2$, $R_2O_2$, and a combination thereof, where R is selected from a group consisting of a saturated or unsaturated linear, branched, or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like. It is believed that the oxidizer facilitates the oxidation of the organic portion of the organometallic precursor to produce volatile by-products and thus preventing incorporation of carbon into the resulting film. Preferably, the oxidizer provided to the deposition chamber 60 with suitable organometallic precursors to deposit a desired BST film is $N_2O$. However, other combinations of oxidizers may be used as well. For example, 100% $O_2$ or a 50%/50% mix of $O_2$ and $N_2O$ may be used.

According to the present invention, the oxidizer flow rate to and/or the partial pressure of the oxidizer in the deposition chamber 60 may be adjusted to control the stoichiometry of the BST film 12 being deposited on substrate assembly 10. For example, preferably, the flow rate of the oxidizer provided to the chamber 60 is about 1 sccm to about 5,000 sccm. Preferably, $N_2O$ flow rates provided to the deposition chamber 60 are in the range of about 100 sccm to 4,000 sccm, more preferably between 500 sccm to about 2,000 sccm, and most preferably between 750 sccm to about 1,250 sccm.

Figure 4:
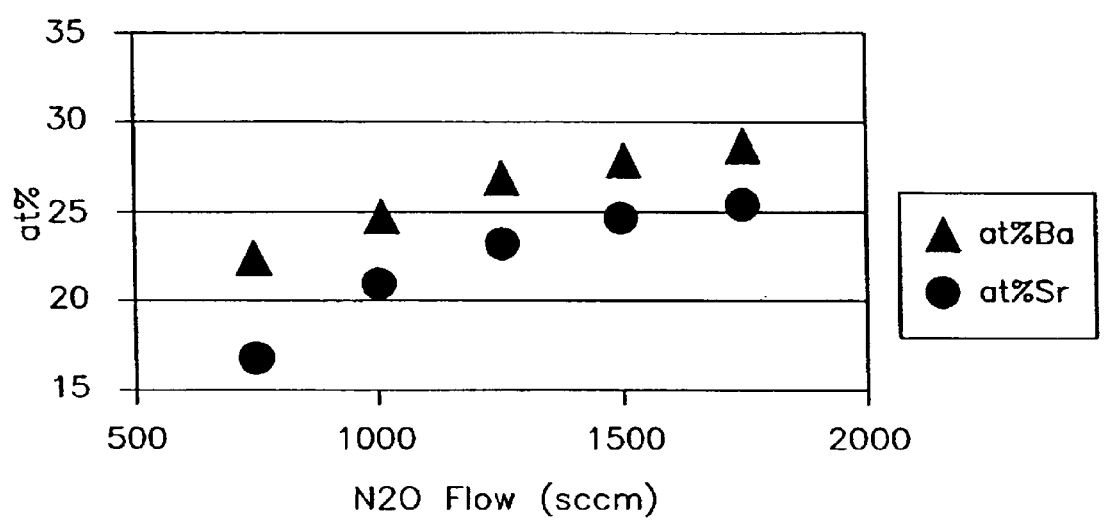
FIG. 4 is a graphical representation of the control of barium and strontium in a BST film according to one exemplary embodiment of the present invention.
Figure 5:
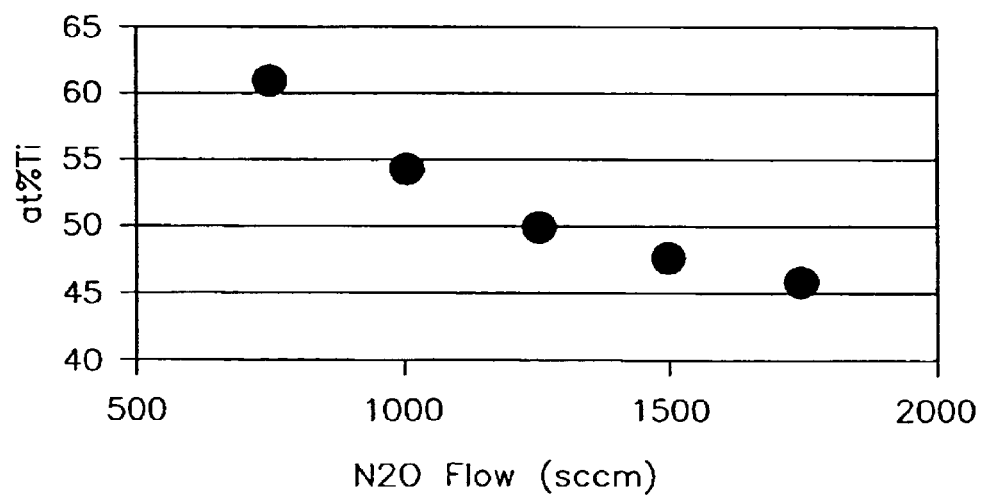
FIG. 5 is a graphical representation of the control of titanium in a BST film according to one exemplary embodiment of the present invention.

Control of stoichiometry of the BST film using the flow rate of $N_2O$ is illustrated and shall be further described below with reference to FIGS. 4–5. For example, in the deposition of a BST film, upon a decrease in the $N_2O$ flow rate, the atomic percent of titanium in the BST film increases as shown in FIG. 5, or, in other words, upon an increase in $N_2O$ flow rate, the atomic percent of titanium in the BST film decreases. In further detail, for example, a decrease of flow rate from 500 sccm to 2,000 sccm may be used under at least one set of conditions to vary the atomic percent of titanium in the BST film from about 60 atomic percent to about 45 atomic percent.

Further, control of the $N_2O$ flow rate can be used to vary the atomic percent of barium and strontium in the BST film. For example, as illustrated in FIG. 4, an increase in the $N_2O$ flow rate from 500 sccm to 2,000 sccm can be used to increase the atomic percent barium in the BST film from about atomic percent to about atomic percent. Also as illustrated in FIG. 4, a like increase in atomic percent of strontium in the BST film from about 15% to about 25% occurs with an increased $N_2O$ flow rate.

Generally, the organometallic precursors from precursor sources 52–54 are provided to the vaporizer 56 at suitable flow rates for depositing the BST film. Preferably, such flow rates for the various precursors including the barium-containing precursor, the strontium-containing precursor, and the titanium-containing precursor include anywhere from 10 milligrams per minute to 1,000 milligrams per minute of liquid feed to any suitable vaporizer. As discussed above, film formation according to the present invention is preferably accomplished using one or more organometallic precursors.

"Organometallic precursor," as used herein, refers to a mononuclear (i.e., monomer) compound having an organic portion and a metallic portion. Various combinations of compounds described herein can be used in the precursor for chemical vapor deposition. The precursor may also include one or more organic solvents suitable for use in chemical vapor deposition, as well as other additives.

As used herein, "organic portion" means a hydrocarbon group that is classified as an aliphatic group, cyclic group, or a combination of aliphatic and cyclic groups (e.g., alkaryl and aralkyl groups). In the context of the present invention, the term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group, including, for example, methyl, ethyl, isopropyl, t-butyl, heptyl, dodecyl, octadecyl, amyl, 2-ethylhexyl, and the like. The term "alkenyl group" means an unsaturated linear or branched hydrocarbon group with one or more carbon-carbon double bonds, such as a vinyl group. The term "alkynyl group" means an unsaturated linear or branched hydrocarbon group with one or more triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

The term "group" is used to describe a chemical substituent that includes the unsubstituted group and the group with nonperoxidic O, N, or S atoms, for example, in the chain as well as carbonyl groups or other conventional substitution. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxylalkyls, hydroxylalkyls, sulfoalkyls, etc. For example, suitable organic groups used in the fabrication of semiconductor devices include cyclopentadienyl, 1,5 cyclooctadiene, and acetylacetonate groups.

Preferably, organometallic precursors useful for forming BST dielectric films in accordance with the present invention preferably include barium, strontium, and titanium. Thus, preferably, in forming a BST film in accordance with the present invention, three organometallic precursors are usually required, i.e., a barium-containing organometallic precursor, a strontium-containing organometallic precursor, and a titanium-containing organometallic precursor. For example, suitable organometallic precursors used in forming a BST film are barium-betadiketonates, strontium-betadiketonates and titanium-betadiketonates. Further, for example, the following BST precursor sets may be used according to the present invention:

1) Ba(thd)$_2$—bis(tetramethylheptanedionate)
   Sr(thd)$_2$—bis(tetamethylheptanedionate)
   Ti(thd)$_2$(O-i-Pr)$_2$—(isoproproxide)bis(tetramethylheptanedionate)
2) Ba(thd)$_2$—bis(tetramethylheptanedionate)
   Sr(thd)$_2$—bis(tetramethylheptanedionate)
   Ti(dmae)$_4$—bis(dimethylaminoethoxide)
3) Ba(methd)$_2$—bis(methoxyethoxyte, tetramethylheptanedionate)
   Sr(methd)$_2$—bis(bis(methoxyethoxyte, tetramethylheptanedionate)
   Ti(mpd)(thd)$_2$—bis(methylpentanediol, tetramethylheptanedionate)
4) Ba(dpm)$_2$—bis(dipivaloylmethanato)
   Sr(dpm)$_2$—bis(dipivaloylmethanato)
   TiO(dpm)$_2$—(titanyl)bis(dipivaloylmethanato)
5) Ba(dpm)$_2$—bis(dipivaloylmethanato)
   Sr(dpm)$_2$—bis(dipivaloylmethanato)
   Ti(t-BuO)$_2$(dpm)$_2$—(t-butoxy)bis(dipivaloylmethanato)
6) Ba(dpm)$_2$—bis(dipivaloylmethanato)
   Sr(dpm)$_2$—bis(dipivaloylmethanato)
   Ti(OCH$_3$)$_2$(dpm)$_2$—(methoxy)bis(dipivaloylmethanato)

Although various precursors are listed above, the present invention is not limited to any particular precursors for forming BST films or any other high dielectric constant film. Further, various adducts may be used in the deposition process, such as, for example, tetraglyme, trietherdiamine, and pentamethyldiethylenetriamine. Yet further, solvents, such as, for example, butylacetate, methanol, and tetrahydrofuran, may also be used in the deposition of BST according to the present invention.

Although, as described above, each of the precursors may be provided separately to the reaction chamber for CVD, several of the precursors may be mixed depending upon the dielectric film being formed. For example, although the barium-containing organometallic precursor, the strontium-containing organometallic precursor, and the titanium-containing organometallic precursor may be provided separately to attain the desired (Ba+Sr)/Ti ratio in the dielectric film, the barium-containing organometallic precursor and strontium-containing organometallic precursor may be mixed in a single container (block 57) at a given Ba/Sr ratio.

With the above in mind, to carry out the deposition of the BST film, the substrate assembly 10, e.g., a wafer including previously formed electrode materials for formation of capacitor structures, upon which the BST film is to be deposited is placed in the reaction chamber 60 at a deposition temperature described herein. The vaporized organometallic precursors from the barium, strontium, and titanium organometallic precursor sources 52–54 are delivered to the deposition chamber, preferably with an oxidizer from oxidizer source 72, as previously described herein, via vaporizer 56 and delivery device 72. The surface 13 upon which a dielectric film 12 is to be deposited is exposed to the vaporized precursors for a time sufficient to produce the BST film, e.g., a couple of minutes, that has suitable effective dielectric properties. The deposition time depends on various factors such as the desired thickness in the film, the deposition rate, etc.

Preferably, a BST dielectric film 12 formed according to the present invention has a thickness of less than about 600 Å, more preferably from about 100 Å to about 300 Å. Preferably, such a BST film is deposited in the range of about 50 Å per minute to about 100 Å per minute.

According to the present invention, an additional hydrogen-containing component may be provided to the deposition chamber 60 from hydrogen-containing component source 87. It is believed that such hydrogen-containing component may assist in breaking the ligands of the one or more organometallic precursors provided to deposition chamber 60. Due to such assistance, the addition of such hydrogen-containing components can also be used to control the stoichiometry of the dielectric film 12 being formed.

Preferably, the hydrogen-containing components include $H_2$, $NH_3$, $N_2H_4$, $N_2H_3(CH_3)$, and $H_2O$ vapor. $H_2$ assists in breaking ligands more effectively for titanium-containing precursors. $NH_3$ also assists in breaking the ligands more effectively for titanium-containing precursors, and may also assist in breaking ligands of barium- and strontium-containing precursors as well. $H_2O$ vapor may also assist in breaking ligands more effectively for titanium-containing precursors, but also may break ligands more effectively for barium and strontium precursors.

As such, to assist in increasing concentration of titanium in a BST film, a hydrogen-containing component may be provided to the deposition chamber during formation of the BST film 12. For example, the hydrogen-containing component may be provided during the entire formation process, or the hydrogen-containing component may be provided during only a period of time to assist in changing the stoichiometry of the dielectric film being deposited. Like the other techniques of controlling the stoichiometry of the BST dielectric film 12 being deposited, addition of one or more of the hydrogen-containing components will change the stoichiometry of layers of the film 12 as desired. Further, the flow rate and/or the partial pressure of the hydrogen-containing components can be used to control the stoichiometry since the incorporation of metals change with the change in flow rate and/or partial pressure of such components.

Various techniques have been presented that can be used during formation of a BST film by CVD. One or more of the above techniques for controlling the stoichiometry of the BST film may be used during the formation of any given film Preferably, such techniques are combined in an optimized fashion to achieve a BST film 12 having a desired stoichiometry. Generally, in one embodiment, while feeding the one or more precursors to the deposition chamber 60, the conditions of the CVD deposition process are changed using one of the techniques described above to facilitate a change in stoichiometry in the film being deposited. As such, upon a change of conditions, e.g., oxidizer flow, distance D, etc., an associated change in stoichiometry occurs. As described previously, for example, the change may be a continuous variation of the conditions during a period of time resulting in a concentration gradient in the film deposited or may be a change from a first set of conditions to one or more additional sets of conditions resulting in one layer of the film formed under the first set of conditions having a certain composition and other layers of the film formed during the other sets of conditions having different compositions.

The high dielectric constant films formed herein may be used in various applications and formed on various substrate assemblies 10. The present process can provide conformal deposition so that the material can be deposited as continuous films into recesses, trenches, and vias, or over step surfaces such as those which are typically microstructured, including those that may have relatively high aspect ratios as well as planar surfaces. The substrate assembly may have a surface of any desired shape, either regular or irregular. For example, such substrate assemblies upon which the film is deposited may be electrode surfaces for use in formation of capacitors such as planar cells, trench cells, and stacked cells, such as the container structures described in U.S. Pat. No. 5,392,189 to Fazan et al., or in U.S. Pat. No. 5,270,241 to Dennison.

Referring to FIG. 2, structure 31 includes a capacitor structure 33 formed relative to substrate assembly 30. The substrate assembly may include various elements. For example, the substrate assembly may include field oxide regions, active regions (i.e., those regions of a silicon substrate not covered by field oxide) wherein active devices such as field effect transistors (FET) are formed, etc.

The capacitor structure 33 includes a dielectric film 34 formed according to the present invention on a bottom electrode 32. The electrode 32 can be formed by any conventional method, such as by chemical vapor deposition, sputtering, and the like. The electrode 32 may be formed of one or more various conductive materials. For example, the electrode 32 may be formed from one or more layers containing platinum, titanium, tantalum, ruthenium, osmium, iron, rhodium, cobalt, nickel, iridium, cerium, tungsten, aluminum, copper, palladium, and/or conductive nitrides or oxides thereof.

The electrode 32 can be deposited on one or more other layers or films of the substrate assembly 30. For example, the electrode 32 may be formed over a barrier film, which may itself be formed over another film, such as an adhesion film. Materials that may be used for such films may, for example, include TiN, Ti, W, Rh, Ru, Ir, $RhO_2$, $RuO_2$, $IrO_2$, TiSiN, WN, WSIN, TaN, TiAl, TaSiN, TiB, TiAlN, TiBN, WBN, $RuSi_x$, $RuSi_xN_y$, $RuSi_xN_yO_z$, Pt—Rh, and Pt—$RhO_x$. It will be recognized by one skilled in the art that the electrode structure may be formed of multiple films or layers and from various materials. As such, the present invention is not limited to any particular electrode material.

A dielectric film 34 is preferably formed over the bottom electrode 32 according to the present invention as described herein. Preferably, the dielectric film 34 is a BST film as described in detail above. The dielectric film 34 preferably includes at least one layer, e.g., interfacial layer, that has a first composition and a second layer, e.g., bulk layer, that has a different composition than the first layer; the composition or stoichiometry of the different layers having been formed using the processes and techniques as described herein for controlling the stoichiometry of high dielectric constant films.

Following the formation of the dielectric film 34, an upper electrode 36 can be provided to form the storage capacitor structure 33. For example, the upper electrode 36 may be formed using CVD or sputtering. Preferably, the upper electrode includes one or more of conductive materials described above with reference to electrode 32 or any other conductive material typically used for forming capacitor electrodes.

All patents, patent documents (including applications), and publications cited herein are incorporated by reference as if each were individually incorporated by reference. Various modifications of this invention will be apparent to those skilled in the art without departing from the scope of this invention, and it should be understood that this invention is not limited to the illustrative embodiments set forth herein.

What is claimed is:

1. A method for depositing a film, the method comprising:

providing a substrate assembly having a surface in a deposition chamber at a temperature less than 680° C., wherein the deposition chamber comprises a delivery device having a delivery outlet region from which one or more organometallic precursors are delivered to within the deposition chamber;

providing a barium-containing organometallic precursor, a strontium-containing organometallic precursor, and a titanium-containing organometallic precursor to the deposition chamber; and forming a barium-strontium-titanate film on at least a portion of the surface using the barium-containing organometallic precursor, the strontium-containing organometallic precursor, and the titanium-containing organometallic precursor provided to the deposition chamber, wherein forming the barium-strontium-titanate film comprises forming at least a first layer of the barium-strontium-titanate film having a first composition and forming at least a second layer of the barium-strontium-titanate film having a second composition; and adjusting a distance between the delivery outlet region of the delivery device and the surface of the substrate assembly during formation of the barium-strontium-titanate film such that composition of the barium-strontium-titanate film is adjusted from the first composition to the second composition.

2. The method of claim 1, wherein the distance is adjusted while a flow rate of the barium-containing organometallic precursor, the strontium-containing organometallic precursor, and the titanium-containing organometallic precursor to the deposition chamber is maintained.

3. The method of claim 1, wherein the method further comprises adjusting a temperature of at least the delivery outlet region of the delivery device during formation of the barium-strontium-titanate film while the flow rate of the barium-containing organometallic precursor, the strontium-containing organometallic precursor, and the titanium-containing organometallic precursor to the deposition chamber is maintained.

4. The method of claim 1, wherein the first layer of the barium-strontium-titanate film is an interfacial layer and the second layer of the barium-strontium-titanate film is a bulk layer, wherein the interfacial layer has an atomic percent of titanium less than or equal to the atomic percent of titanium in the bulk layer of the barium-strontium-titanate film.

5. The method of claim 1, wherein providing a substrate assembly having a surface in a deposition chamber comprises maintaining the temperature of the substrate assembly in the range of about 400° C. to 550° C.

6. The method of claim 1, wherein the method further comprises adjusting a deposition pressure of the deposition chamber during formation of the barium-strontium-titanate film while the flow rate of the barium-containing organometallic precursor, the strontium-containing organometallic precursor, and the titanium-containing organometallic precursor to the deposition chamber is maintained.

7. A method for depositing a film, the method comprising:
providing a substrate assembly having a surface in a deposition chamber at a temperature less than 680° C.;
providing a barium-containing organometallic precursor, a strontium-containing organometallic precursor, a titanium-containing organometallic precursor, and an oxidizer to the deposition chamber;
forming a barium-strontium-titanate film on at least a portion of the surface using the barium-containing organometallic precursor, the strontium-containing organometallic precursor, the titanium-containing organometallic precursor, and the oxidizer provided to the deposition chamber, wherein forming the barium-strontium-titanate film comprises forming at least a first layer of the barium-strontium-titanate film having a first composition and forming at least a second layer of the barium-strontium-titanate film having a second composition; and
adjusting a deposition pressure of the deposition chamber during formation of the barium-strontium-titanate film while a flow rate of the barium-containing organometallic precursor, the strontium-containing organometallic precursor, and the titanium-containing organometallic precursor to the deposition chamber is maintained such that composition of the barium-strontium-titanate film is adjusted from the first composition to the second composition, wherein an increase in deposition pressure results in an increase in percent titanium in the barium-strontium-titanate film and also an increase in a rate of deposition of the barium-strontium-titanate film.

8. The method of claim 7, wherein providing the substrate assembly in the deposition chamber comprises providing a deposition chamber including a delivery device having a delivery outlet region, wherein the method further comprises adjusting a distance between the delivery outlet region of the delivery device and the surface of the substrate assembly during formation of the barium-strontium-titanate film while the flow rate of the barium-containing organometallic precursor, the strontium-containing organometallic precursor, and the titanium-containing organometallic precursor to the deposition chamber is maintained.

9. The method of claim 7, wherein providing the substrate assembly in the deposition chamber comprises providing a deposition chamber including a delivery device having a delivery outlet region, wherein the method further comprises adjusting a temperature of at least the delivery outlet region of the delivery device during formation of the barium-strontium-titanate film while the flow rate of the barium-containing organometallic precursor, the strontium-containing organometallic precursor, and the titanium-containing organometallic precursor to the deposition chamber is maintained.

10. A method for use in formation of a capacitor, the method comprising:
providing a first electrode having a surface in a deposition chamber at a temperature less than 680° C., wherein the deposition chamber comprises a delivery device having a delivery outlet region from which one or more organometallic precursors are delivered to within the deposition chamber;
forming a barium-strontium-titanate dielectric film on at least a portion of the surface of the first electrode, wherein forming the barium-strontium-titanate film comprises:
providing a barium-containing organometallic precursor, a strontium-containing organometallic precursor, and a titanium-containing organometallic precursor to the deposition chamber, and
depositing a barium-strontium-titanate film on at least a portion of the surface using the barium-containing organometallic precursor, the strontium-containing organometallic precursor, and the titanium-containing organometallic precursor, wherein depositing the barium-strontium-titanate film comprises forming at least a first layer of the barium-strontium-titanate film having a first composition and forming at least a second layer of the barium-strontium-titanate film having a second composition, and
adjusting a distance between the delivery outlet region of the delivery device and the surface of the substrate assembly during formation of the barium-strontium-titanate film such that composition of the barium-strontium-titanate film is adjusted from the first composition to the second composition; and
forming a second electrode on at least a portion of the barium-strontium-titanate dielectric film.

11. The method of claim 10, wherein the distance is adjusted while a flow rate of the barium-containing organometallic precursor, the strontium-containing organometallic precursor, and the titanium-containing organometallic precursor to the deposition chamber is maintained.

12. The method of claim 10, wherein the method further comprises adjusting a temperature of at least the delivery outlet region of the delivery device during formation of the barium-strontium-titanate film while the flow rate of the barium-containing organometallic precursor, the strontium-containing organometallic precursor, and the titanium-containing organometallic precursor to the deposition chamber is maintained.

13. The method of claim 10, wherein the first layer of the barium-strontium-titanate film is an interfacial layer and the second layer of the barium-strontium-titanate film is a bulk layer, wherein the interfacial layer has an atomic percent of titanium less than or equal to the atomic percent of titanium in the bulk layer of the barium-strontium-titanate film.

14. The method of claim 10, wherein the method further comprises adjusting a deposition pressure of the deposition chamber during formation of the barium-strontium-titanate film while the flow rate of the barium-containing organometallic precursor, the strontium-containing organometallic precursor, and the titanium-containing organometallic precursor to the deposition chamber is maintained.

15. A method for use in formation of a capacitor, the method comprising:
providing a first electrode having a surface in a deposition chamber at a temperature less than 680° C.;
forming a barium-strontium-titanate dielectric film on at least a portion of the surface of the first electrode, wherein forming the barium-strontium-titanate film comprises:
providing a barium-containing organometallic precursor, a strontium-containing organometallic precursor, a titanium-containing organometallic precursor, and an oxidizer to the deposition chamber,
forming a barium-strontium-titanate film on at least a portion of the first electrode surface using the barium-containing organometallic precursor, the strontium-containing organometallic precursor, the titanium-containing organometallic precursor, and the oxidizer provided to the deposition chamber, wherein forming the barium-strontium-titanate film comprises forming at least a first layer of the barium-strontium-titanate film having a first composition and forming at least a second layer of the barium-strontium-titanate film having a second composition, and
adjusting a deposition pressure of the deposition chamber during formation of the barium-strontium-titanate film such that composition of the barium-strontium-titanate film is adjusted from the first composition to the second composition, wherein an increase in deposition pressure results in an increase in percent titanium in the barium-strontium-titanate film and also an increase in a rate of deposition of the barium-strontium-titanate film; and
forming a second electrode on at least a portion of the barium-strontium-titanate dielectric film.

16. The method of claim 15, wherein the deposition pressure is adjusted while a flow rate of the barium-containing organometallic precursor, the strontium-containing organometallic precursor, and the titanium-containing organometallic precursor to the deposition chamber is maintained.

17. The method of claim 15, wherein providing the oxidizer to the deposition chamber comprises providing at least one of $O_2$, $O_3$, $N_2O$, NO, $SO_3$, $H_2O_2$, $R_2O_2$ to the deposition chamber, where R is selected from a group consisting of a saturated or unsaturated linear, branched, or cyclic hydrocarbon group having about 1 carbon atom to about 20 carbon atoms, preferably about 2 carbon atoms to about 12 carbon atoms, for example, methyl, ethyl, isopropyl, t-butyl, heptyl, dodecyl, octadecyl, amyl, 2-ethylhexyl, and the like.

18. The method of claim 15, wherein the first layer of the barium-strontium-titanate film is an interfacial layer and the second layer of the barium-strontium-titanate film is a bulk layer, wherein the interfacial layer has an atomic percent of titanium less than or equal to the atomic percent of titanium in the bulk layer of the barium-strontium-titanate film.

19. The method of claim 15, wherein the deposition chamber comprises a delivery device having a delivery outlet region, wherein the method further comprises adjusting a distance between the delivery outlet region of the delivery device and the surface of the substrate assembly during formation of the barium-strontium-titanate film while the flow rate of the barium-containing organometallic precursor, the strontium-containing organometallic precursor, and the titanium-containing organometallic precursor to the deposition chamber is maintained.

20. The method of claim 15, wherein the deposition chamber comprises a delivery device having a delivery outlet region, wherein the method further comprises adjusting a temperature of at least the delivery outlet region of the delivery device during formation of the barium-strontium-titanate film while the flow rate of the barium-containing organometallic precursor, the strontium-containing organometallic precursor, and the titanium-containing organometallic precursor to the deposition chamber is maintained.

21. A method of forming a titanium-containing dielectric film comprising:
providing a substrate assembly having a surface in a deposition chamber at a temperature less than 680° C., wherein the deposition chamber comprises a delivery device having a delivery outlet region;
providing a barium-containing organometallic precursor, a strontium-containing organometallic precursor, a titanium-containing organometallic precursor, and an oxidizer to the deposition chamber; and
depositing a barium-strontium-titanate film on at least a portion of the surface using the barium-containing organometallic precursor, the strontium-containing organometallic precursor, the titanium-containing organometallic precursor, and the oxidizer provided to the deposition chamber; and
decreasing a distance between the delivery outlet region of the delivery device and the surface of the substrate assembly during the deposition of the barium-strontium-titanate film to increase the percent titanium in the barium-strontium-titanate film.

22. The method of claim 21, wherein the distance is decreased while the flow rate of the barium-containing organometallic precursor, the strontium-containing organometallic precursor, and the titanium-containing organometallic precursor to the deposition chamber is maintained.

23. The method of claim 21, wherein the method further comprises adjusting a deposition pressure of the deposition chamber during formation of the barium-strontium-titanate film while the flow rate of the barium-containing organometallic precursor, the strontium-containing organometallic precursor, and the titanium-containing organometallic precursor to the deposition chamber is maintained to increase a rate of depositing the barium-strontium-titanate film.

24. A method for depositing a dielectric film, the method comprising:
providing a substrate assembly having a surface in a deposition chamber at a temperature less than 680° C.;
providing a plurality of precursors comprising A and B to the deposition chamber having the substrate assembly positioned therein to deposit a film of $ABO_3$ on at least a portion of the surface of the substrate assembly, wherein the deposition chamber comprises a delivery device having a delivery outlet region from which one or more precursors are delivered to within the deposition chamber; and adjusting a distance between the delivery outlet region of the delivery device and the surface of the substrate assembly during deposition of the $ABO_3$ film to produce different concentrations of one of A and B at different elevations in the $ABO_3$ film.

25. The method of claim 24, wherein the distance is adjusted while maintaining a flow rate of the precursors comprising A and B provided to the deposition chamber.

26. The method of claim 24, wherein the precursors comprising A and B include a barium-containing organometallic precursor, a strontium-containing organometallic precursor, and a titanium-containing organometallic precursor.

27. The method of claim 24, wherein the different concentrations include a concentration in a first layer of the $ABO_3$ film that is different from a concentration of a second layer of the $ABO_3$ film.

28. The method of claim 24, wherein the different concentrations are a gradient in concentrations in a portion of the $ABO_3$ film.

29. The method of claim 24, wherein the method further comprises adjusting a temperature of at least the delivery outlet region of the delivery device during formation of the $ABO_3$ film.

30. The method of claim 24, wherein the method further comprises adjusting a deposition pressure of the deposition chamber during formation of the $ABO_3$ film.

31. A method for depositing a dielectric film, the method comprising:

providing a substrate assembly having a surface in a deposition chamber at a temperature less than 680° C.;

providing a plurality of precursors comprising A and B to the deposition chamber having the substrate assembly positioned therein to deposit a film of $ABO_3$ on at least a portion of the surface of the substrate assembly along with an oxidizer; and adjusting a deposition pressure of the deposition chamber during deposition of the $ABO_3$ film to produce different concentrations of one of A and B at different elevations in the $ABO_3$ film while maintaining a flow rate of the precursors comprising A and B provided to the deposition chamber, wherein an adjustment in deposition pressure also results in an adjustment to a rate of deposition of the $ABO_3$ film.

32. The method of claim 31, wherein the precursors comprising A and B include a barium-containing organometallic precursor, a strontium-containing organometallic precursor, and a titanium-containing organometallic precursor.

33. The method of claim 31, wherein the different concentrations include a concentration in a first layer of the $ABO_3$ film that is different from a concentration of a second layer of the $ABO_3$ film.

34. The method of claim 31, wherein the different concentrations are a gradient in concentrations in a portion of the $ABO_3$ film.

35. The method of claim 31, wherein providing the substrate assembly in the deposition chamber comprises providing a deposition chamber including a delivery device having a delivery outlet region, wherein the method further comprises adjusting a distance between the delivery outlet region of the delivery device and the surface of the substrate assembly during formation of the $ABO_3$ film.

36. The method of claim 31, wherein providing the substrate assembly in the deposition chamber comprises providing a deposition chamber including a delivery device having a delivery outlet region, wherein the method further comprises adjusting a temperature of at least the delivery outlet region of the delivery device during formation of the $ABO_3$ film.

* * * * *